United States Patent
Burroughs et al.

[11] Patent Number: 5,850,145
[45] Date of Patent: Dec. 15, 1998

[54] APPARATUS AND METHOD FOR SOFT ERROR COMPARISON TESTING

[75] Inventors: Gregory D. Burroughs; Edward G. Weaver, Jr., both of Sunnyvale; Donald L. Rogers, San Jose, all of Calif.

[73] Assignee: Hewlett-Packard Co., Palo Alto, Calif.

[21] Appl. No.: 707,848

[22] Filed: Sep. 9, 1996

[51] Int. Cl.[6] .................................................. G01R 31/28
[52] U.S. Cl. ............................................................. 324/751
[58] Field of Search ................................ 324/73.1, 158.1, 324/765, 762, 763, 750, 752, 501; 365/200, 201; 371/22.1, 22.2, 22.3, 22.6, 15.1, 38

[56] References Cited

U.S. PATENT DOCUMENTS

| | | | |
|---|---|---|---|
| 4,379,259 | 4/1983 | Varadi et al. | 395/183.21 |
| 4,493,081 | 1/1985 | Schmidt | 371/38 |
| 5,132,752 | 7/1992 | Umemoto et al. | 365/154 |

OTHER PUBLICATIONS

Craig Lage, et al., "Soft Error Rate and Stored Charge Requirements in Advanced–High–Density SRAMs", article, IEEE, 0–7803–1450–6, pp. 33.4.1–33.4.4, 1993 (Unavailable Month).

Timothy J. O'Gorman, "The Effect of Cosmic Rays on the Soft Error Rate of a DRAM at Ground Level", article, IEEE, 0018–9383/94, pp. 553–557, 1994 (Unavailable Month).

G.R. Srinivasan, et al., "Accurate, Predictive Modeling of Soft Effor Rate Due to Cosmic Rays and Chip Alpha Radiation", article, IEEE/IRPS, CH3332–4/94/0000–0012, pp. 12–16, 1994 (Unavailable Month).

J.F. Ziegler, et al., "IBM experience in soft fails in computer electronics (1978–1994)", article, IBM J. Res. Develop., vol. 40, No. 1, pp. 3–18, Jan. 1996.

J.F. Ziegler, et al., "Accelerated testing for cosmic soft–error rate", article, IBM J. Res. Develop., vol. 40, No. 1, pp. 51–72, Jan. 1996.

W.R. McKee, et al., "Cosmic Ray Neutron Induced Upsets as a Major Contributor to the Soft Error Rate of Current and Future Generation DRAMs", article, IEEE, International Reliability Physics Proceedings, pp. 1–6, Apr./May, 1996.

*Primary Examiner*—Vinh P. Nguyen
*Attorney, Agent, or Firm*—Jack Lenell

[57] ABSTRACT

A method and apparatus for soft error comparison testing of electronic components exposed to a flux of high energy particles, while providing for simultaneous comparison testing of different components at full rated operating speed, and providing for programmable control of level of the supply voltage applied to the components. Included a method and apparatus for simultaneously exposing electronic components to a flux of high energy particles, operating the components, and simultaneously measuring soft errors of the components induced by the flux of high energy particles.

16 Claims, 5 Drawing Sheets

APPARATUS AND METHOD FOR SOFT ERROR COMPARISON TESTING

FIELD OF THE INVENTION

The invention generally relates to soft error testing of electronic components, and more particularly soft error comparison testing of electronic components exposed to a flux of high energy particles.

BACKGROUND OF THE INVENTION

Errors in electronic components effect reliability of electronic assemblies such as digital computer systems that use the components. Hard errors are defined as permanent failures of components. In contrast, soft errors are defined as a spontaneous errors or changes that can not be reproduced. For example, soft errors in memory components used in digital components are spontaneous errors or changes in information stored in the memories, which can not be reproduced.

Soft errors in electronic components are caused by a variety of electrical noise sources. For example, exposure to high energy particles, including particles produced by radioactivity or extraterrestrial cosmic rays, causes soft errors in electronic components used in military or satellite applications, as well as other applications.

Cosmic rays also interact with the earth's atmosphere to create cascades of new and different secondary particles. Typically, what hits the earth at sea level is the sixth generation cascade of secondary particles, with none of the original particles of the cosmic rays left. This cascade contains many of the particles known to physicists, including not only the stable particles of protons, neutrons, and electrons, but also transient particles such as pions and muons.

High energy particles can cause soft errors in silicon memory components through three effects: induced charge, recoil, and neutron capture. For the induced charge effect, charged particles passing through silicon create an induced charge along the path of the charged particle. Electron-hole pairs are generated. Holes are swept into the substrate and electrons are collected on nearby storage nodes. If sufficient charge is collected, the logical state of a memory cell can flip, for example, from a logical 1 to a logical 0, or vice-versa.

The recoil effect occurs when a high energy particle strikes a silicon atom in an elastic collision. The silicon lattice keeps the atom "in place", with a burst of energy transferred to the silicon as charge. If sufficient charge is collected, again, the logical state of the memory cell can flip.

For the neutron capture effect, low energy neutrons can be captured by the atomic nuclei of elements used in chips (e.g., Silicon and Boron). When a neutron is captured, an alpha particle results. The alpha particle can then induce charge and cause the logical state of memory cell to flip as described.

Testing for soft errors in electronic components is difficult because naturally occurring soft errors are infrequent. Artificial sources of a high flux of high energy particles can be used to stimulate soft error in electronic components at an enhanced rate. However, the high flux of high energy particles from an artificial source may do more than just stimulate soft errors. During the course of testing, there may be permanent damage to a component so that the entire component ceases functioning, or alternatively just one or more of the data channels of the component cease functioning so that they are "stuck bits" locked into a logical 1 or logical 0 state. Terminating testing and addressing this issue may cause an undesirable extension of testing time and may cause loss of integrity in testing data.

Furthermore, there are limitations in measuring and controlling artificial sources. In particular, flux levels of high energy particles provided by such artificial sources vary significantly over time and are difficult to measure without error. Since flux level is directly proportional to soft error rate, variations in flux level over time translate into variations in number soft errors over time. Accordingly, it is difficult to correlate soft error measurements of a first device made during a first time period, with soft error measurements of a different device made during a later time period.

The inventors desired to investigate how factors such as operating speed, supply voltage, and design lay-out and implementation may effect soft errors. What is needed for such investigation is an automatic, flexible, and efficient method and apparatus for soft error comparison testing of electronic components exposed to a flux of high energy particles, which provides for simultaneous comparison testing of different components at full rated operating speed, and provides for programmable control of level of the supply voltage applied to the components.

SUMMARY OF THE INVENTION

The present invention provides an automatic, flexible, and efficient method and apparatus for soft error comparison testing of electronic components exposed to a flux of high energy particles, while providing for simultaneous comparison testing of different components at full rated operating speed, and providing for programmable control of level of the supply voltage applied to the components.

Briefly and in general terms the invention includes a method and apparatus for simultaneously exposing electronic components to a flux of high energy particles, operating the components, and simultaneously measuring soft errors of the components induced by the flux of high energy particles.

The electronic components include an electronic component of a first functional type having a first design configuration, for example a static random access memory type component having a first memory design configuration. The components further include another electronic component of the same functional type but having a design configuration different than the first design configuration, for example a static random access memory type component having a memory design configuration different than the first memory design configuration. The soft errors of the components are recorded. Soft errors of the component having the first design configuration are correlated with the component having the design configuration different than the first design configuration.

The flux of high energy particles are generated using an artificial source, for example a nuclear accelerator. The simultaneous comparison testing provided by the invention is particularly advantageous since flux levels of high energy particles provided by such artificial sources vary significantly over time, and variations in flux level over time translate into variations in number soft errors over time. Accordingly, the invention avoids correlation errors that would otherwise occur if soft error measurements were made on a first device made during a first time period, and then compared with soft error measurements made on a different device during a later time period.

Other aspects and advantages of the present invention will become apparent from the following detailed description,

DETAILED DESCRIPTION OF PREFERRED EMBODIMENT

It is theorized that factors such as operating speed, supply voltage, and design lay-out and implementation may effect soft errors. The present invention provides an automatic, flexible, and efficient method and apparatus for soft error comparison testing of electronic components exposed to a flux of high energy particles, while providing for simultaneous comparison testing of different components at full rated operating speed, and providing for programmable control of level of the supply voltage applied to the components.

Figure 1:
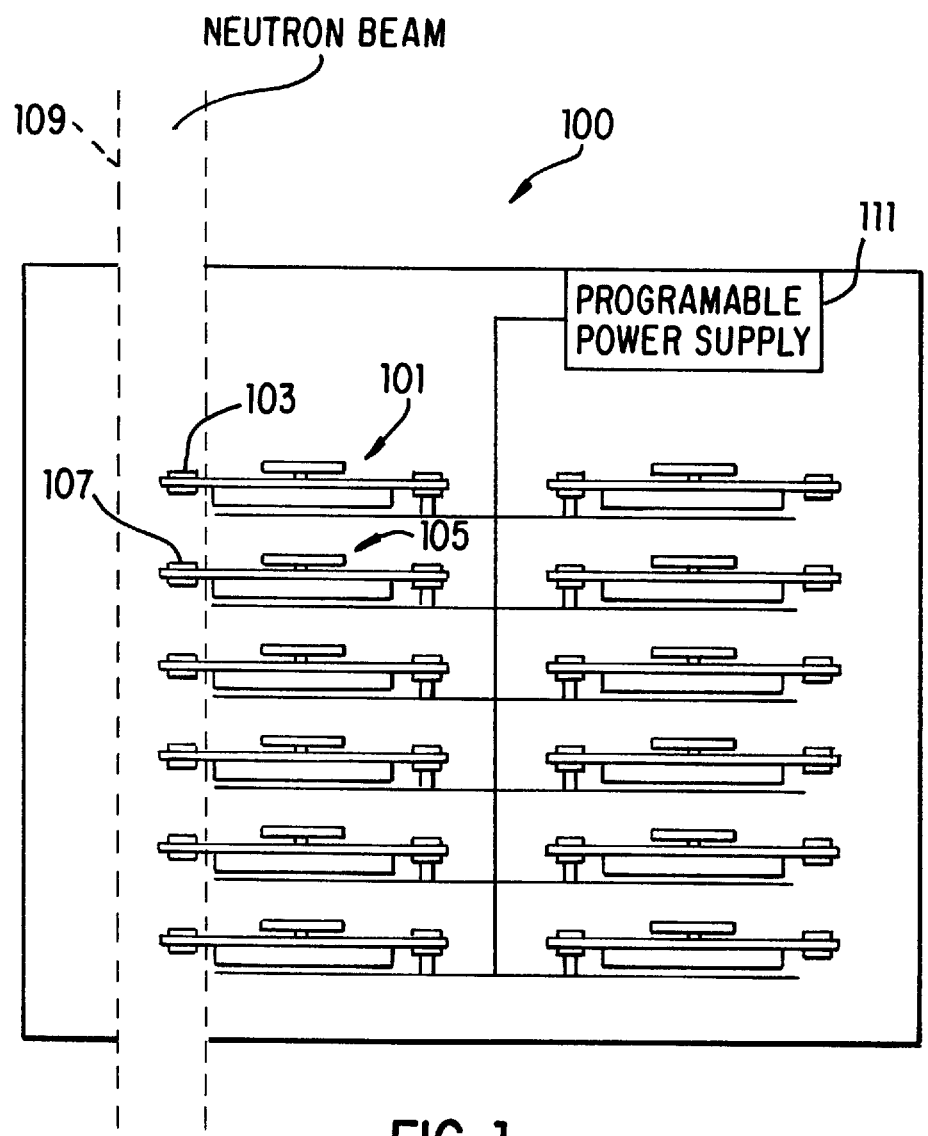
FIG. 1 shows a cross sectional view of a partial block diagram of a preferred embodiment of the invention.

FIG. 1 shows a cross sectional view of a partial block diagram of a preferred embodiment of the invention. An assembly 100 includes a metal case supporting and substantially enclosing a plurality of printed circuit board modules having interconnected electronic components. A first printed circuit board module 101 includes an electronic component of a first functional type having a first design configuration, preferably a static random access memory type component 103 having a first memory design configuration.

Another printed circuit board module 105 includes another electronic component of the same functional type but having a design configuration different than the first design configuration, preferably a static random access memory type component 107 having a memory design configuration different than the first memory design configuration. In accordance with the principles of the invention, both components 103, 107 are simultaneously disposed within a flux beam of high energy particles, preferably a neutron beam 109. It is believed that the spatial ordering or arrangement of the components within the beam does not substantially effect intensity of the flux beam of high energy particles.

Of course neutron beams are invisible. The neutron beam 109 is representatively illustrated in FIG. 1 by dashed lines. As shown, first and second apertures are cut in the metal case to provide for unimpeded entrance and exit for the neutron beam 109.

As shown in FIG. 1, simultaneous soft error testing of additional different designs of components of the same functional type is provided by additional printed circuit board modules having the components under test for soft errors disposed within the beam. The flux of high energy particles stimulates soft errors in the electronic components at an enhanced rate. As shown, the assembly may also use further additional modules not disposed in the beam as experimental controls.

At least one processing element is coupled with at least one of the components under test for simultaneously measuring soft errors of both components stimulated by the flux of high energy particles disposed within the beam of high energy particles. In the preferred embodiment, each printed circuit board module includes a respective processor element proximately coupled with the component for measuring soft errors at a full rated operating speed of the component. All processor elements are operating simultaneously, so as to provide for simultaneous comparison testing for soft errors of the different components.

A programmable power supply 111 is coupled with the processing element for receiving instructions therefrom, and coupled with the components for providing programmable control of a level of the supply voltage applied to the components. The power supply is sufficiently spaced away from the flux beam so that the power supply operates free from any error stimulation by the flux beam.

Figure 2:
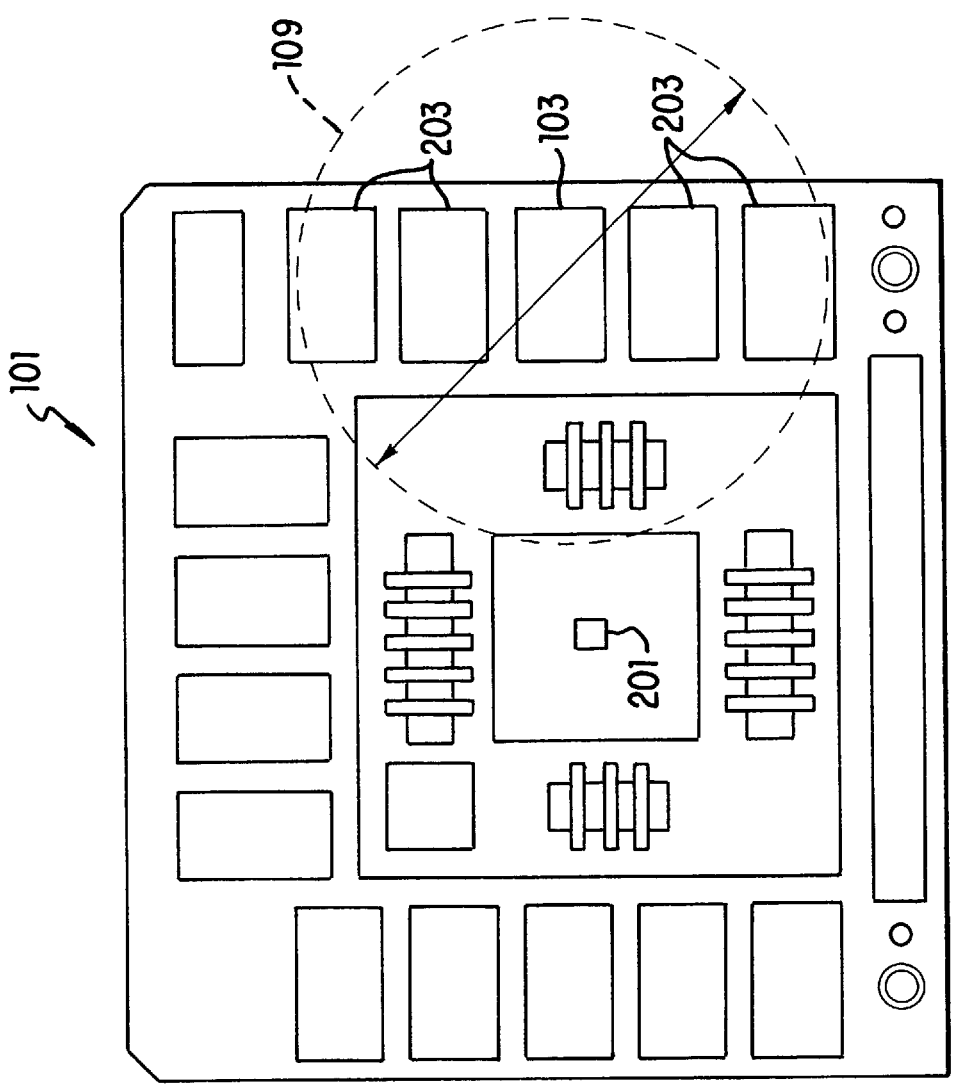
FIG. 2 shows a detailed top view of the first one of the printed circuit board modules 101 of FIG. 1

FIG. 2 shows a detailed top view of the first one of the printed circuit board modules 101 of FIG. 1 disposed within the neutron beam. As shown in FIG. 2, a first processor element 201, preferably a microprocessor, is proximately coupled with the component for measuring soft errors at a full rated operating speed of the component 103, for example at a ten nanosecond rated access time of the static random access memory type component 103. Preferably, the processor is also coupled to additional components 203 that are similar to the first component 103.

In the preferred embodiment, diameter of the neutron beam 109 is approximately three and one quarter inches. The printed circuit board modules are situated so that the components under test for soft errors are disposed within the flux of high energy particles, but the processor elements are sufficiently spaced away from the flux of high energy particles so that soft errors are not induced in the processor elements by the flux of high energy particles. For the neutron beam 109 of the preferred embodiment, flux levels tail off quickly to ambient within approximately one and one half inches of the circumference of the neutron beam. Accordingly, in the preferred embodiment shown FIG. 2, the processor 201 is spaced on the order of approximately one and a half inches or more away from the circumference of the neutron beam 109. In the preferred embodiment, other printed circuit board modules disposed in the neutron beam are similarly arranged as in the first printed circuit board module 101 shown in FIG. 2.

Figure 3:
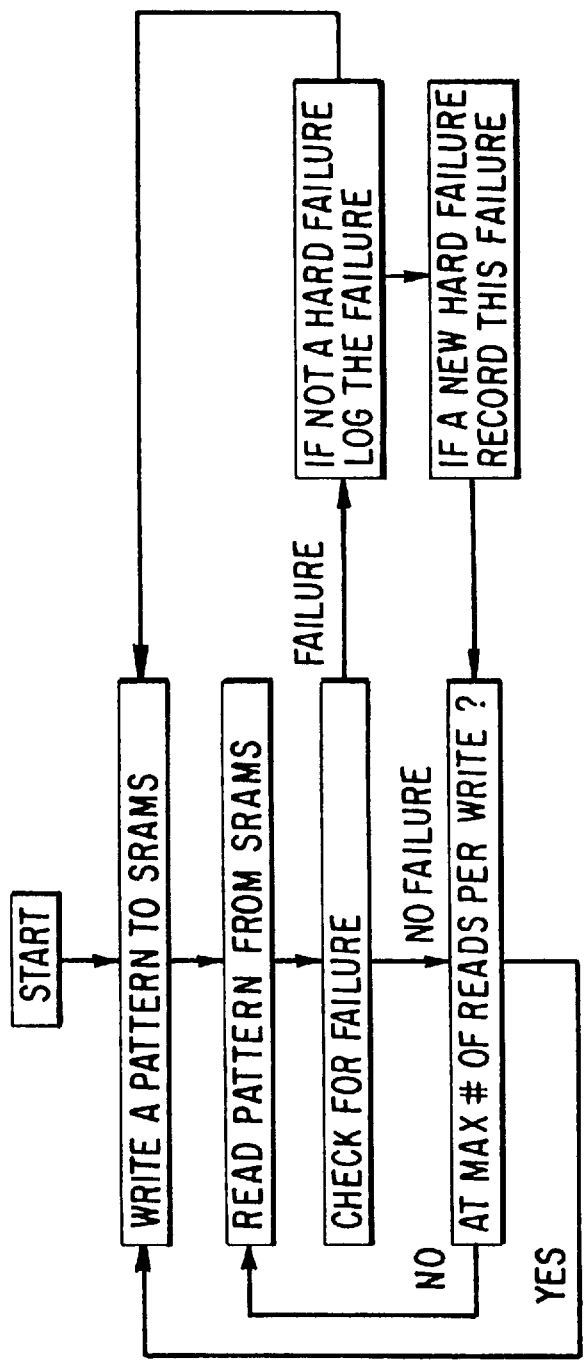
FIG. 3 shows a simplified flow chart illustrating a soft error test program of the invention.

FIG. 3 shows a simplified flow chart illustrating a respective soft error test program that is run by each of the processor elements, while all processors are operating simultaneously. As shown in FIG. 3, the processor element writes a pattern to the one or more components of the printed circuit board module that are disposed within the neutron beam, which are static random access memory components (SRAMs) in the preferred embodiment. The processor then reads back the pattern and compares the written pattern to the read pattern, so as to check for an error in the pattern indicating a failure. If there is no failure, and the processor and component have completed a preselected maximum number of reads per write, then the process is began again with the processor element writing the pattern. Alternatively, if there is no failure and the processor is not operating at a maximum number of reads per write, then the pattern is read again and checked again.

If checking for an error in the pattern indicates a failure, then it must be determined whether the error is a soft error, which corresponds to a soft failure, or a hard error, which corresponds to a hard failure. It should be understood that the flux of high energy particles may do more than just stimulate soft errors. During the course of testing, there may be permanent damage to a component so that the entire component ceases functioning, or alternatively just one or more of the data channels of the component cease functioning so that they are "stuck bits" locked into a logical 1 or logical 0 state. Terminating testing and addressing this issue would cause an undesirable extension of testing time and may cause loss of integrity in testing data. Accordingly, in the preferred embodiment of the invention the processor element writes a complementary value to the memory location where the, failure occurred and reads back the value from that memory location. If the complementary value is read back, then the bit is not stuck and the error is a soft error, which is then recorded as such in another memory device coupled to the processor. If the complementary value is not read back, then the bit is stuck and the error is a hard error, which is then separately recorded as such. As shown in the flow chart of FIG. 3, testing is continued without substantial interruption.

Figure 4:
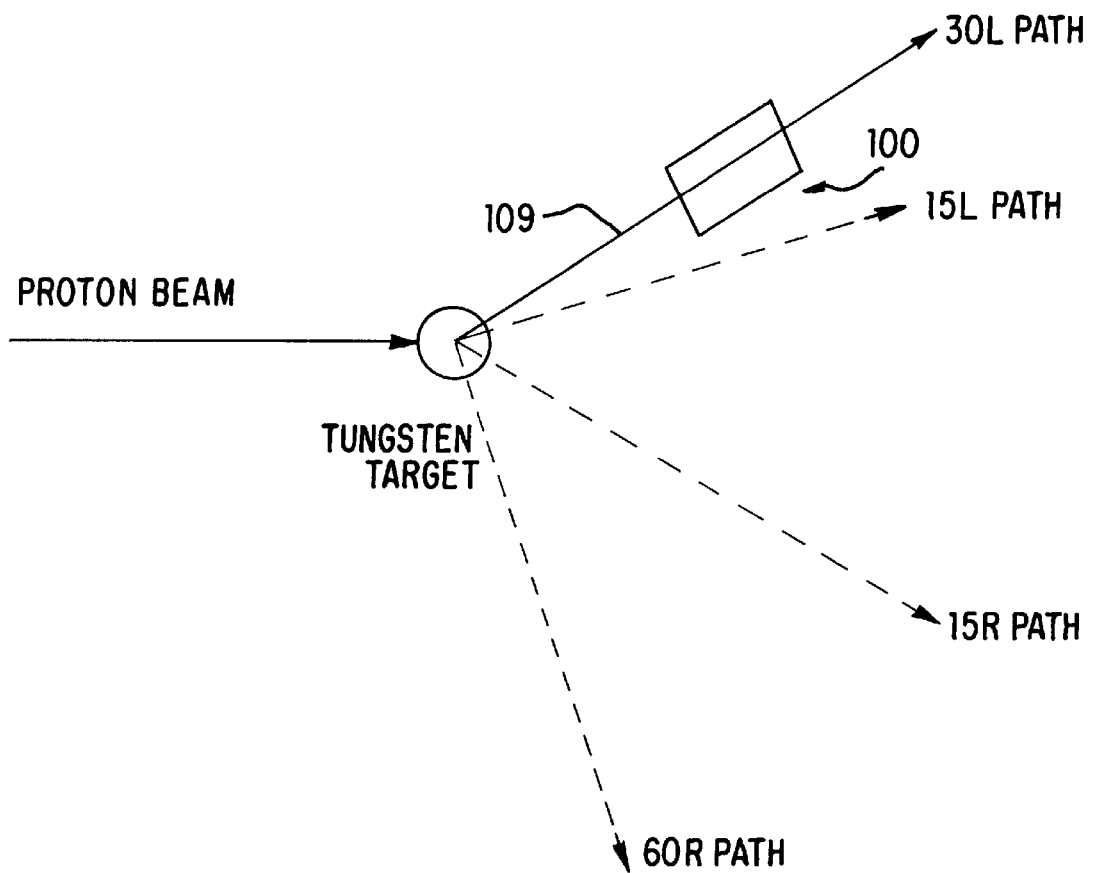
FIG. 4 is a diagram illustrating a preferred arrangement of the assembly of the invention with respect to an artificial source of high energy particles.

FIG. 4 is a diagram illustrating a preferred arrangement of the assembly 100 of the invention with respect to an artificial source of the flux of high energy particles. The neutron beam 109 of the preferred embodiment has an energy profile that closely matches those of cosmic neutrons at sea level on earth. A nuclear accelerator produces a stream of high speed protons that is directed at a rod of tungsten encased in a concrete dome. Beams of high energy neutrons result, which are directed out of the dome in beams at various angles relative to the incident protons. The neutron beam 109 of the preferred embodiment is oriented along the 30L-degree path and provides a neutron energy spectrum between ten million electron volts and one hundred seventy million electron volts (10–170 MeV). This matches the neutron energy spectrum at sea level, but with a flux that is approximately one hundred million times greater than ambient naturally occurring neutrons at sea level. An example of a suitable artificial source of the flux of high energy particles may be found at the Weapons Neutron Research facility at Los Alamos National Laboratory, located in the United States in the state of New Mexico The simultaneous comparison testing provided by the invention is particularly advantageous since flux levels of high energy particles provided by the artificial source may vary significantly over time, and variations in flux level over time translate into variations in number soft errors over time. For example, during an extended test periods number of soft errors in some components varied over time by approximately twenty five percent.

Figure 5:
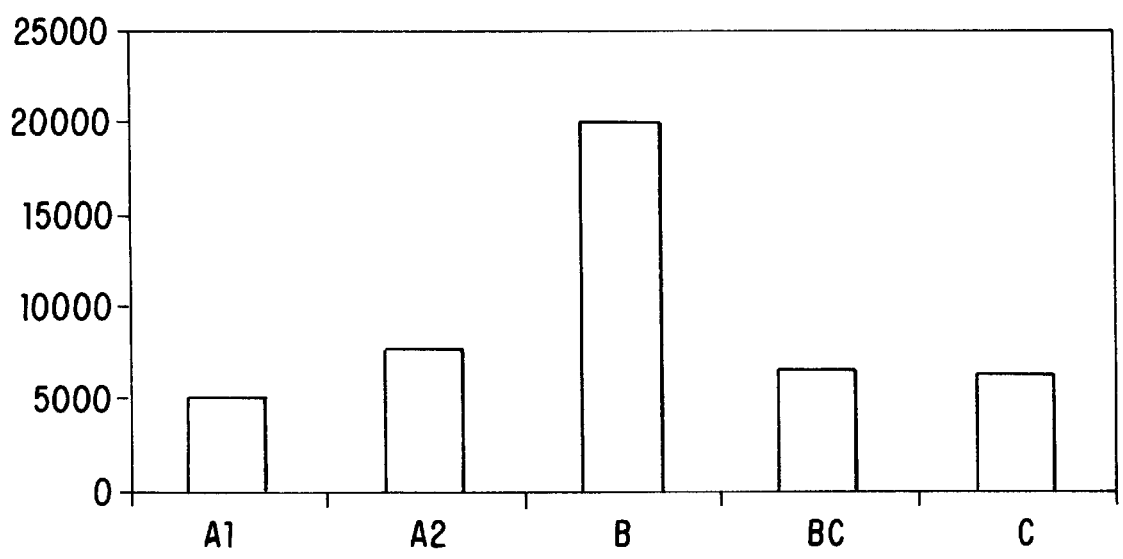
FIG. 5 shows a graph correlating soft errors for different component designs.

FIG. 5 is a graph correlating number of soft errors simultaneously measured during a single comparison testing period for different designs for static random access memory components, while operating at top rated speed of the components. The components are designated as A1, A2, B, BC, and C. As shown, some designs have a much higher number of soft errors than others.

In additional comparison tests, the programmable power supply varied level of the supply voltage applied to the components during soft error testing in response to instructions received from the processing element. Using the invention, soft errors for various different components were measured at various different voltage levels applied to the components, ranging from below to above a nominal voltage level. The soft error testing showed that the components have various different soft error responses under various different applied voltage levels.

The present invention provides an automatic, flexible, and efficient method and apparatus for soft error comparison testing of electronic components exposed to the flux of high energy particles. Although specific embodiments of the invention have been described and illustrated, the invention is not to be limited to the specific forms or arrangements of parts so described and illustrate, and various modifications and changes can be made without departing from the scope and spirit of the invention. Within the scope of the appended claims, therefore, the invention may be practiced otherwise than as specifically described and illustrated.

What is claimed is:

1. A method comprising the steps of:

providing a flux of high energy particles;

simultaneously exposing the flux to an electronic component of a first functional type having a first design configuration and to another electronic component of the same functional type but having a design configuration different than the first design configuration;

operating the components; and simultaneously measuring soft errors of both components induced by the flux of high energy particles.

2. A method as in claim 1 further comprising a step of recording the soft errors of the components.

3. A method as in claim 1 further comprising a step of correlating the soft errors of the component having the first design configuration with the component having the design configuration different than the first design configuration.

4. A method as in claim 3 further comprising a step of programmably controlling level of a supply voltage applied to the components so as to vary the level of the supply voltage applied to the components.

5. A method as in claim 1 wherein the step of operating the components includes operating the components at a full rated operating speed of the components.

6. A method as in claim 1 wherein the step of simultaneously measuring soft errors of both components includes checking for permanent damage to the components.

7. A method as in claim 1 wherein the step of simultaneously measuring soft errors of both components includes simultaneously checking for permanent damage to the components and maintaining a separate record of hard errors if a component is permanently damaged.

8. A method as in claim 1 further comprising a step of varying a level of a supply voltage applied to the components while measuring soft errors of the components.

9. An apparatus comprising:

a flux beam of high energy particles;

an electronic component of a first functional type having a first design configuration; and another electronic component of the same functional type but having a design configuration different than the first design configuration, wherein both components are simultaneously disposed within the flux beam; and means coupled with the components for simultaneously measuring soft errors of both components induced by the flux of high energy particles.

10. An apparatus as in claim 9 further comprising means for recording the soft errors of the components.

11. An apparatus as in claim 9 wherein the functional type of the components is a memory.

12. An apparatus comprising:

a flux beam of high energy particles;

an electronic component of a first functional type having a first design configuration; and another electronic component of the same functional type but having a design configuration different than the first design configuration, wherein both components are simultaneously disposed within the flux beam; and at least one processing element coupled with at least one of the components for simultaneously measuring soft errors of both components induced by the flux of high energy particles.

13. An apparatus as in claim 12 wherein the processing element is proximately coupled with the component for measuring soft errors at a full rated operating speed of the component.

14. An apparatus as in claim 12 wherein the functional type of the components is a memory.

15. An apparatus as in claim 12 further comprising a programmable power supply coupled with the processing element for receiving instructions therefrom, and coupled with the components for providing programmable control of a level of the supply voltage applied to the components.

16. An apparatus as in claim 15 wherein the power supply is sufficiently spaced away from the flux beam so that the power supply operates free from any error stimulation by the flux beam.

* * * * *